United States Patent [19]

Aoyagi

[11] Patent Number: 5,244,527
[45] Date of Patent: Sep. 14, 1993

[54] MANUFACTURING UNIT FOR SEMICONDUCTOR DEVICES

[75] Inventor: Nobuaki Aoyagi, Yamagata, Japan

[73] Assignee: NEC Corporation, Japan

[21] Appl. No.: 912,846

[22] Filed: Jul. 13, 1992

[30] Foreign Application Priority Data

Aug. 6, 1991 [JP] Japan .................................. 3-195642

[51] Int. Cl.[5] ........................ H01L 21/306; B44C 1/22
[52] U.S. Cl. ..................................... 156/345; 156/626; 156/640; 156/656; 156/665
[58] Field of Search ............... 156/345, 626, 627, 640, 156/665, 656, 659.1; 356/357; 134/25.4, 153, 902

[56] References Cited

U.S. PATENT DOCUMENTS 5,032,217 7/1991 Tanaka ........................... 156/626 X
5,069,002 12/1991 Sandhu et al. ................. 156/626 X

*Primary Examiner*—William A. Powell
*Attorney, Agent, or Firm*—Laff, Whitesel, Conte & Saret

[57] ABSTRACT

A sensor for detecting the end point of etching is secured to a wafer chuck and a light projector and light receiver of an infrared photosensor which is used as the sensor for detecting the end point for aluminum etching rotates in synchronization with the rotation of a wafer during the etching process and the end point of etching is judged by a judgement circuit which receives a signal from the sensor for detecting the etching end point. In a spin etcher for the wafer, the sensor constantly monitors the same location on the wafer and thus prevents misjudgment of the end point of etching by an unstable waveform of the end-point detection signal.

9 Claims, 4 Drawing Sheets

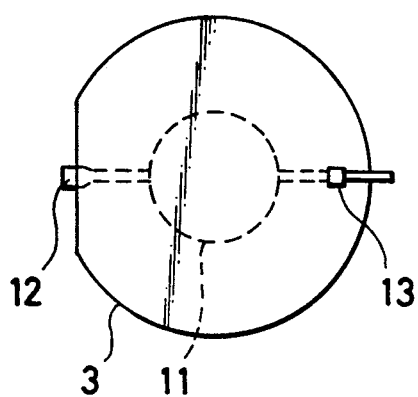
FIG.3A
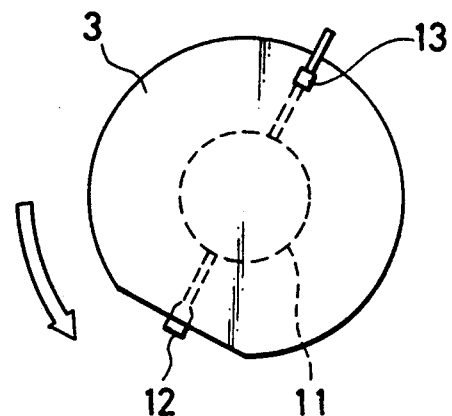
FIG.3B
FIG.4
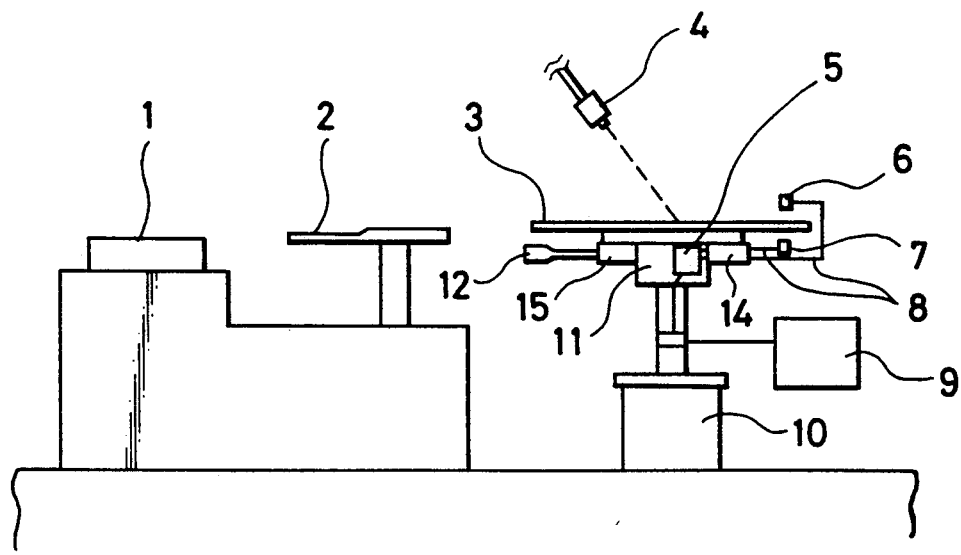

MANUFACTURING UNIT FOR SEMICONDUCTOR DEVICES

BACKGROUND OF THE INVENTION

1. Field of the Invention

This invention relates to a manufacturing unit for semiconductor devices, and in more particular to a manufacturing unit for semiconductor devices in which a wafer is secured using vacuum adsorption and an etching solution is dropped or sprayed on the wafer while rotating or spinning it to thereby perform etching of a thin metallic film (for example, a thin aluminum film)(From here on the unit will be called a spin etcher).

2. Description of the Prior Art

To describe prior spin etchers, an example of a spin etcher for a thin aluminum film will be used and described in reference to the drawing. FIG. 1 is a drawing showing the construction of a prior aluminum spin etcher. A thin aluminum film is formed on a wafer 3 and will be used as a mask when forming a wiring and implanting impurities into the wafer 3, and on top of this thin aluminum film a photoresist masking pattern is formed in order to obtain the prescribed aluminum pattern using etching. The wafer 3 is carried by a wafer chuck 11 and secured using vacuum adsorption. The aluminum etching process of the wafer 3 is performed by using a spin motor 10 to rotate the wafer chuck 11 and rotate the wafer 3 while at the same time spraying an aluminum etching solution on the wafer 3 using an etching solution spray nozzle 4. The end of the aluminum etching process is judged by monitoring the status of the aluminum etching using an end-point detection sensor. When etching aluminum, a photosensor which uses infrared rays with a wavelength of approximately 950 nm is used as the end-point detection sensor.

Next, the end-point detection mechanism will be described. First, the infrared rays generated by a light emitting diode inside the photoelectric element 5 of the end-point detection sensor travel along an optical fiber cable 8 and are projected from the light projector 7 of the end-point detection sensor onto the rear surface of the wafer. Aluminum has the characteristic of absorbing infrared rays and so the amount of infrared rays that penetrates the wafer changes depending on the status of the aluminum etching. The infrared rays that penetrate the wafer 3 pass along the optical fiber cable 8 from the light receiver 6 of the end-point detection sensor and are converted into photoelectric current by a phototransistor inside the photoelectric element 5 of the end-point detection sensor, and then sent as an electric signal to the etching-end-point judgement circuit 9. In the etching-end-point judgement circuit 9, a drop in the voltage is monitored by using the photoelectric current, and the end point of the etching is judged by the voltage change for a unit time. When the end point of the etching has been judged, the rotation of the spin motor 10 stops and the spray of the etching solution from the etching solution spray nozzle 4 stops, and the etching process ends.

In the prior spin etcher described above, while the wafer is rotating during the etching process, the light which penetrates the wafer is detected by the end-point detection sensor which is fixed in an arbitrary location, therefore the location of the etching pattern on the wafer where the status of the etching is monitored constantly changes with the rotation of the wafer, and the waveform of the end-point detection signal obtained from the photosensor is very unstable and so there is a problem in that it is very easy for the etching-end-point judgement circuit to misjudge the end point of the etching.

When judging the end point of the etching for aluminum etching, the photosensor monitors weak voltage changes which are 1% or less of the initial voltage and it requires an end-point detection signal waveform that has become stable. Aluminum etching normally advances at a rate of 80 angstroms per second and so if the end point of the etching is misjudged, the dimensions of the aluminum pattern are far off the designed dimensions and this causes various characteristic errors in semiconductor chips and causes a reduction in reliability.

SUMMARY OF THE INVENTION

An object of this invention is to provide a manufacturing unit for semiconductor devices (spin etcher) which can prevent misjudgment of the end point of the etching by using an etching-end-point judgement circuit.

The aforementioned object of this invention is effectively accomplished by providing a manufacturing unit for semiconductor devices which includes a rotation mechanism that secures a semiconductor wafer and rotates it, and a mechanism that applies an etching solution used for etching a thin metallic film formed on the surface of the wafer, which is on the rotation mechanism, wherein the manufacturing unit comprises a sensor for detecting the end point of etching that is secured to the rotation mechanism and rotates in synchronization with the rotation of the wafer, and a circuit for judging the end point of the etching using an electrical signal from the sensor for detecting the end point of etching.

BRIEF DESCRIPTION OF THE DRAWINGS

The aforementioned and other objects, features and advantages of the present invention will become more apparent from the following description taken with reference to the accompanying drawings, wherein;

FIGS. 3A and 3B are partial top views of FIG. 2, describing the operation;

FIG. 4 is a drawing showing the construction of a second embodiment of this invention;

DESCRIPTION OF THE PREFERRED EMBODIMENTS

This invention comprises an etching-end-point detection sensor which is secured to a wafer rotation mechanism and which rotates in synchronization with the rotation of the wafer, and even during etching while the wafer is rotating, it can constantly monitor the etching status of the same pattern location on the wafer.

Next, to describe the spin etcher of this invention, an example of a spin etcher for a thin aluminum film will be used and described in reference to the drawings.

Figure 1:
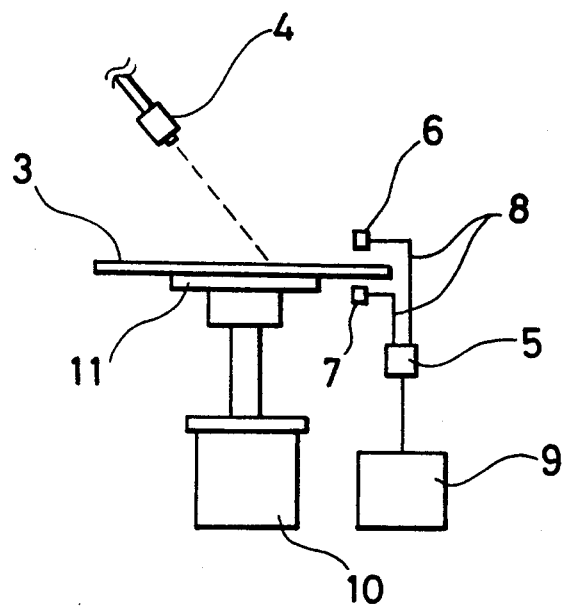
FIG. 1 is a drawing showing the construction of a prior manufacturing unit for semiconductor devices.
Figure 2:
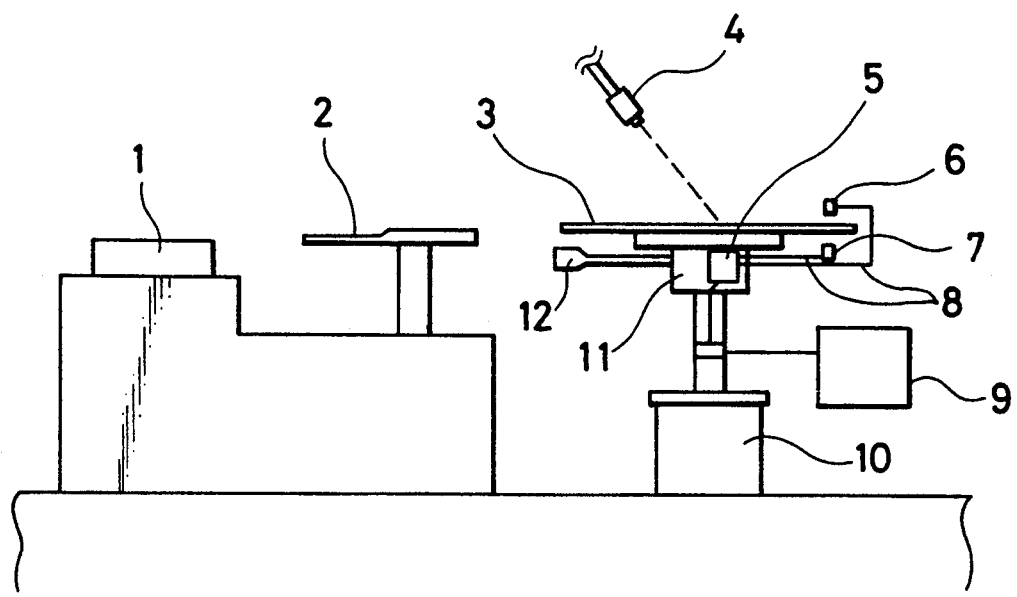
FIG. 2 is a drawing showing the construction of a first embodiment of this invention.

FIG. 2 is a drawing which shows the construction of a first embodiment of this invention. A thin aluminum film is formed on a wafer 3 to be used as a mask during the formation of wiring and while impurities are implanted, and in order to obtain the prescribed aluminum pattern by using etching, a photoresist masking pattern is formed on the thin aluminum film. First, the wafer 3 is positioned in the prescribed location on a wafer positioning stage 1, and then it is carried to a wafer chuck 11 by a wafer-carrying chuck 2 and secured by vacuum adsorption. The reason for positioning the wafer is so that during sequential processing of wafers, the same pattern location is always located between a light receiver 6 and a light projector 7 of the end-point detection sensor.

The aluminum etching process of the wafer 3 is performed by using a spin motor 10 to rotate the wafer chuck 11 and rotate the wafer 3, while at the same time an aluminum etching solution is sprayed on the wafer 3 from an etching solution spray nozzle 4. The end of etching the aluminum is judged by monitoring the status of the aluminum etching using the end-point detection sensor. When etching aluminum, a photosensor which uses infrared rays with a wavelength of approximately 950 nm is used as the end-point detection sensor. In this invention, this end-point detection sensor is secured to the wafer chuck 11 and rotates in synchronization with the rotation of the wafer. A balancer 12 is used to balance the weight of the sensor in order to stabilize the rotation of the wafer chuck 11.

Following, the end-point detection mechanism for this embodiment of the invention will be described. First, the infrared rays generated from a light emitting diode inside a photoelectric element 5 of the end-point detection sensor travel along an optical fiber cable 8 and are projected from the light projector 7 of the end-point detection sensor onto the rear of the wafer. Aluminum has the characteristic of absorbing infrared rays, therefore, the amount of infrared rays penetrating the wafer changes depending on the status of the aluminum etching. The infrared rays that penetrate the wafer 3 travel from the light receiver 6 of the end-point detection sensor along the optical fiber cable 8 and are converted in photoelectric current by a phototransistor inside the photoelectric element 5 of the end-point detection sensor, and then sent as an electric signal to the etching-end-point judgement circuit 9. In the etching-end-point judgement circuit 9, drops in voltage are monitored according to the photoelectric current, and the end point of the etching is judged from the amount of change in the voltage for a unit time. When the end point of the etching is judged, the rotation of the spin motor 10 and the spray of etching solution from the etching solution spray nozzle 4 stop, and the etching process ends.

FIGS. 3A and 3B are top views of the wafer chuck as shown in FIG. 2 and each describe the operation. As mentioned above, in this embodiment of the invention, the end-point detection sensor is secured to the wafer chuck 11, therefore, the rotation of the wafer 3 and the rotation of the light projector 7 and light receiver 6 of the end-point detection sensor are synchronous, and when the wafer 3 rotates from the status shown in FIG. 3A to the status shown in FIG. 3B in the direction of an arrow therein, the light projector 7 and the light receiver 6 are in the position 13 and the end-point detection sensor constantly monitors the pattern of the same location on the wafer, and thus a stable waveform of the end-point detection signal can be obtained.

Next, a second embodiment of this invention will be described with reference to the drawings. FIG. 4 is a drawing showing the construction of the second embodiment of this invention. It differs from the first embodiment in that the location of the light receiver 6 of the end-point detection sensor and that of the light projector 7 of the end-point detection sensor can be adjusted by a sensor positioning mechanism 14. By using the sensor positioning mechanism, the optimum waveform of the end-point detection signal can be more accurately obtained by adjusting the position of the sensor to a prescribed position of the pattern on the wafer before starting the etching process. A balancer positioning mechanism 15 positions the balancer 12 so that it corresponds to the sensor adjustment.

Figure 5A:
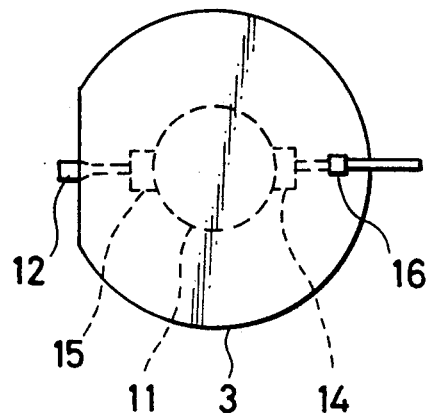
FIGS. 5A and 5B are partial top views of FIG. 4, describing the operation.
Figure 5B:
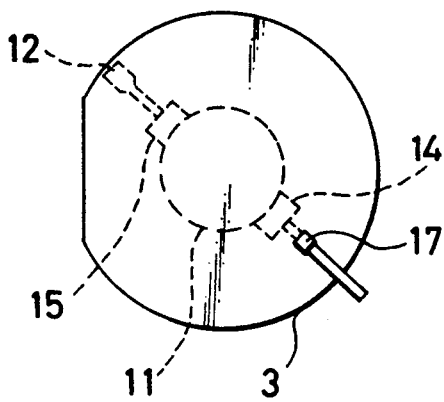

FIGS. 5A and 5B are top views of the wafer chuck as shown in FIG. 4 and each describe the operation. The positions of the light projector 7 and light receiver 6 of the end-point detection sensor are adjusted by the sensor positioning mechanism 14 from the initial set position 16 shown in FIG. 5A to the detection position 17 for an optimum signal waveform, thus improving the precision of the end-point detection.

Figure 6:
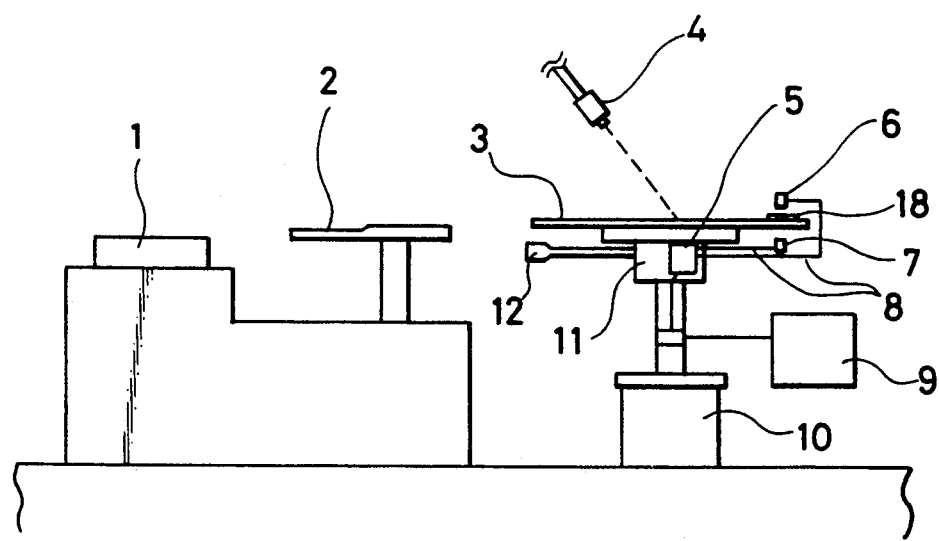
FIG. 6 is a drawing showing the construction of a third embodiment of this invention.

Next, a third embodiment of this invention will be described with reference to the drawings. FIG. 6 is a drawing showing the contruction of the third embodiment of this invention. In this third embodiment, an exclusive photoresist pattern formation section 18 for end-point detection is arranged in a prescribed location on the wafer 3, and here an exclusive photoresist pattern 19 is formed for end-point detection, and during etching, this exclusive pattern is positioned between the light receiver 6 and the light projector 7 of the end-point detection sensor and is used for monitoring the status of the aluminum etching. This embodiment of the invention is very effective when there is a mixture of patterns on the wafer that have extremely different areas for etching and the displancements in the waveform of the end-point detection signal are generated with multiple stages, thus making it difficult to judge the end point of the etching, or when etching a pattern with extremely tight end-point margins. In this embodiment of the invention, it is possible to monitor the etching status of an exclusive pattern in order to obtain the optimum waveform of the end-point detection signal, thus making it possible to greatly improve the precision of detecting the end point.

The above photoresist pattern formation section may be arranged in a prescribed location on the wafer in the construction as shown in FIG. 4.

Figure 7:
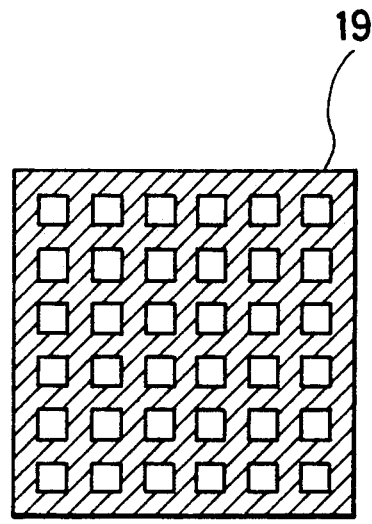
FIG. 7 is a top view which describes an example of the photoresist pattern for detecting the end point as shown in FIG. 6.

FIG. 7 is a drawing showing an enlargement of the exclusive photoresist pattern 19 for detecting the end point. A lattice type photoresist pattern is systematically arranged, and the pattern is formed so that etching advances uniformly.

As was described above, in the spin etcher of this invention, a sensor used for detecting the end point of the etching is secured to the rotation mechanism of the wafer, and the sensor rotates in synchronization with the rotation of the wafer, making it possible to constantly monitor the etching status of a pattern in the same location on the wafer, thus being very effective in preventing misjudgment of the end point of the etching so that a stable waveform of the end-point detection signal can be obtained.

What is claimed is:

1. A manufacturing unit for semiconductor devices which includes a rotation mechanism that secures a semiconductor wafer and rotates it and a mechanism that applies an etching solution used for etching a thin metallic film formed on the surface of said wafer, which is on said rotation mechanism, comprising a sensor for detecting the end point of etching that is secured to said rotation mechanism and rotates in synchronization with the rotation of said wafer, and a circuit for judging the end point of etching using an electrical signal from said sensor for detecting the end point of etching.

2. The manufacturing unit as defined in claim 1 which further comprises a balancing means for balancing the weight of said sensor to stabilize the rotation of said rotation mechanism.

3. The manufacturing unit as defined in claim 2 which further comprises a sensor positioning mechanism for adjusting the location of a light projector of said sensor and that of a light receiver thereof and a mechanism for positioning said balancing means corresponding to the sensor adjustment.

4. The manufacturing unit as defined in claim 2 which further comprises a photoresist pattern formation section for detecting the end point of etching.

5. The manufacturing unit as defined in claim 1 wherein said thin metallic film is a thin aluminum film.

6. A manufacturing unit for semiconductor devices which includes a rotation mechanism having a wafer chuck on which a semiconductor wafer is secured and a spin motor for rotating said wafer chuck, and a spray nozzle for applying an etching solution used for etching a thin metallic film formed on the surface of said wafer, which is on said rotation mechanism, comprising a sensor for detecting the end point of etching which includes a photoelectric element and a light projector and a light receiver each being connected to said element through an optical fiber cable, said sensor being secured to said rotation mechanism and rotating in synchronization with the rotation of said wafer, a balancer for balancing the weight of said sensor to stabilize the rotation of said rotation mechanism, and a circuit for judging the end point of etching using an electrical signal from said sensor.

7. The manufacturing unit as defined in claim 6 which further comprises a sensor positioning mechanism for adjusting the location of said light projector and that of said light receiver and a mechanism for positioning said balancer corresponding to the sensor adjustment.

8. The manufacturing unit as defined in claim 6 which further comprises a photoresist pattern formation section for detecting the end point of etching.

9. The manufacturing unit as defined in claim 6 wherein said thin metallic film is a thin aluminum film.

* * * * *